United States Patent
Mandal et al.

[11] Patent Number: 6,107,184
[45] Date of Patent: Aug. 22, 2000

[54] NANO-POROUS COPOLYMER FILMS HAVING LOW DIELECTRIC CONSTANTS

[75] Inventors: Robert P. Mandal, Saratoga; David Cheung, Foster City; Peter Wai-Man Lee, San Jose; Chi-I Lang, Sunnyvale, all of Calif.

[73] Assignee: Applied Materials, Inc., Santa Clara, Calif.

[21] Appl. No.: 09/207,791

[22] Filed: Dec. 9, 1998

[51] Int. Cl.$^7$ .................................................. H01L 21/4763
[52] U.S. Cl. ........................ 438/623; 438/780; 438/781; 438/958; 427/255.6; 427/489; 427/490
[58] Field of Search .................................. 438/623, 780, 438/781, 958; 427/255.6, 489, 490

[56] References Cited

U.S. PATENT DOCUMENTS

| | | | |
|---|---|---|---|
| 3,895,135 | 7/1975 | Hofer | 427/248 |
| 4,500,562 | 2/1985 | Jahn et al. | 427/27 |
| 4,556,584 | 12/1985 | Sarkozy | 427/54.1 |
| 4,945,856 | 8/1990 | Stewart | 118/715 |
| 5,121,706 | 6/1992 | Nichols et al. | 118/719 |
| 5,270,802 | 12/1993 | Lin et al. | 427/539 |
| 5,355,832 | 10/1994 | Loh et al. | 118/723 |
| 5,424,097 | 6/1995 | Olson et al. | 427/255.5 |
| 5,491,112 | 2/1996 | Buchta et al. | 437/225 |
| 5,534,068 | 7/1996 | Beach et al. | 118/719 |
| 5,536,317 | 7/1996 | Crain et al. | 118/664 |
| 5,536,319 | 7/1996 | Wary et al. | 118/719 |
| 5,536,321 | 7/1996 | Olson et al. | 118/719 |
| 5,536,322 | 7/1996 | Wary et al. | 118/719 |
| 5,536,892 | 7/1996 | Dolbier, Jr. et al. | 570/144 |
| 5,538,758 | 7/1996 | Beach et al. | 427/255.6 |
| 5,556,473 | 9/1996 | Olson et al. | 118/719 |
| 5,709,753 | 1/1998 | Olson et al. | 118/719 |
| 5,958,510 | 9/1999 | Sivaramakrishnam et al. | 427/255.6 |

FOREIGN PATENT DOCUMENTS 0063369  4/1985  Japan .

OTHER PUBLICATIONS

Taylor et al. , "Parylene Copolymers", Mat. Tes. Soc. Symp. Proc. vol. 476, pp. 197–205, 1997.

Gaynor and Desu, "Low Dielectric constant, high temprea-ture stable copolyner thin films by room temperature chemi-cal vapor deposition", Mat, Res. Soc. Symp. Troc. vol. 343, pp. 541–546, 1994.

Gaynor and Desu, "Room temperature copolymerization to improve the thermal and dielectric properties of polyxy-lylene thin films by chemical vapor deposition", J. Mater. Res., vol. 9, No. 12, pp. 3125–3130, 1997.

Shin–Puu Jeng, Mi–Chang Chang, Tara Kroger, Peter McAnally, and Robert H. Havemann, "A Planarized Multi-level Interconnect Scheme With Embedded Low–Dielectric–Constant Polymers For Sub–Quarter–Mi-cron Applications," VLSI, Feb. 1994, 2 pages.

Encyclopedia of Polymer Science and Engineering, "Xylylene Polymers," vol. 17, $2^{nd}$ Edition, pp. 990–1025.

Ashok K. Sharma, "Parylene C at Subambient Tempera-tures," Journal of Polymer Science, vol. 26, 1988, pp. 2953–2971.

(List continued on next page.)

*Primary Examiner*—John F. Niebling
*Assistant Examiner*—Ha Tran Nguyen
*Attorney, Agent, or Firm*—Thomason, Moser & Patterson

[57] ABSTRACT

A method and apparatus for forming thin copolymer layers having low dielectric constants on semiconductor substrates includes in situ formation of p-xylylenes, or derivatives thereof, from solid or liquid precursors such as cyclic p-xylylene dimer, p-xylene, 1,4-bis(formatomethyl) benzene, or 1,4-bis(N-methyl-aminomethyl)benzene. P-xylylene is copolymerized with a comonomer having labile groups that are converted to dispersed gas bubbles after the copolymer layer is deposited on the substrate. Preferred comonomers comprise diazocyclopentadienyl, diazoquinoyl, formyloxy, or glyoxyloyloxy groups.

11 Claims, 7 Drawing Sheets

OTHER PUBLICATIONS

H. Yasuda, "Plasma Polymerization," Academic Press, Inc., 1985, pp. 65–71.

McGraw–Hill Dictionary of Chemistry, Sybil P. Parker, 3 pages.

N. Irving Sax and Richard J. Lewis, Sr., Hawley's Condensed Chemical Dictionary, 11$^{th}$ Edition, 3 pages.

Doklady Akademii Nauk SSSR, "Doklady Chemistry—Proceedings of the Academy of Sciences of the USSR," Russian Original, vol. 319, No. 1–3, Jul., 1991.

S. Dabral, X Zhang, B. Wang, G–R Yang, T–M Lu and J.F. McDonald, "Metal–Parlylene Interconnection Systems," Mat. Res. Soc. Symp. Proc., vol. 381, ©1995 Materials Research Society, pp. 205–215.

NANO-POROUS COPOLYMER FILMS HAVING LOW DIELECTRIC CONSTANTS

FIELD OF THE INVENTION

This invention relates to a method for forming a thin polymer layer on a substrate. More particularly, this invention relates to an apparatus and method for forming low dielectric constant films from p-xylylene during fabrication of integrated circuits.

BACKGROUND OF THE INVENTION

In the construction of integrated circuits, device geometries are constantly shrinking, resulting in an increase in parasitic capacitance between devices. Parasitic capacitance between metal interconnects on the same or adjacent layers in the circuit can result in crosstalk between the metal lines or interconnects and in a reduction of the response time of the device. Lowering the parasitic capacitance between metal interconnects separated by dielectric material can be accomplished by either increasing the thickness of the dielectric material or by lowering the dielectric constant of the dielectric material. Increasing the thickness of the dielectric materials, however, does not address parasitic capacitance within the same metallized layer or plane.

As a result, to reduce the parasitic capacitance between metal interconnects on the same or adjacent layers, one must change the material used between the metal lines or interconnects to a material having a lower dielectric constant than that of the materials currently used, i.e., silicon dioxide ($SiO_2$), $k \approx 4.0$.

Jeng et al. in "A Planarized Multilevel Interconnect Scheme with Embedded Low-Dielectric-Constant Polymers for Sub-Quarter-Micron Applications", published in the Journal of Vacuum and Technology in June 1995, describes the use of a low dielectric constant polymeric material, such as parylene, as a substitute for silicon dioxide ($SiO_2$) between tightly spaced conductive lines or other strategically important areas of an integrated circuit structure. Parylene, a generic name for thermoplastic polymers and copolymers based on p-xylylene and substituted p-xylylene monomers, has been shown to possess suitable physical, chemical, electrical, and thermal properties for use in integrated circuits. Deposition of such polymers by vaporization and decomposition of a stable cyclic dimer, followed by deposition and polymerization of the resulting reactive monomer, is discussed by Ashok K. Sharma in "Parylene-C at Subambient Temperatures", published in the Journal of Polymer Science: Part A: Polymer Chemistry, Vol. 26, at pages 2953–2971 (1988). Properties of such polymeric materials, including their low dielectric constants, are further discussed by R. Olson in "Xylylene Polymers", published in the Encyclopedia of Polymer Science and Engineering, Volume 17, Second Edition, at pages 990–1024 (1989).

Several parylene films have been developed for deposition within integrated circuits. Parylene-N is deposited from unsubstituted p-xylylene at substrate temperatures below about 70–90° C. The parylene-N films typically do not adhere well to silicon oxide and other semiconductor surfaces. Furthermore, parylene-N films typically have poor thermal stability at temperatures above about 400° C. Thermal stability of parylene films is improved by fluorinating or chlorinating the cyclic dimer of p-xylylene to make parylene-F films or parylene-C films. However, the substituted p-xylylene cyclic dimers are even more expensive than the unsubstituted cyclic dimer and are more difficult to process. In addition, the fluorine or chlorine within the films can corrode metal electrical interconnects when an electrical bias is applied.

The p-xylylene cyclic dimer typically used as the parylene precursor is formed as a solid that is separated from the reactants and other products during formation of the cyclic dimer. Although the cyclic dimer is very expensive, the cyclic dimer provides a controllable deposition process for making parylene films having low dielectric constants. The cyclic dimer is produced from p-xylene, or a derivative thereof.

P-xylylene copolymers having thermal stability above 400° C. and dielectric constants as low as 2.1 are described in Taylor et al., Parylene Copolymers, Mat. Res. Soc. Symp., Proc. Vol. 476 (1997), pp. 197–205. P-xylylene is condensed on a substrate in the presence of a comonomer, such as tetravinyltetramethylcyclotetrasiloxane, and the resulting copolymer film is stated to have better thermal stability and lower dielectric constants than parylene-N films.

P-xylylene copolymer films having lower dielectric constants than about 2.1 would further improve on integrated circuit performance. However, useful comonomers for making the films have not been identified.

SUMMARY OF THE INVENTION

The present invention provides a method and apparatus for depositing a dielectric layer having a low dielectric constant from a source of p-xylylene and a source of a comonomer having thermally labile groups that are converted to dispersed gas bubbles during subsequent processing. In particular, a method and apparatus is provided for condensation of p-xylylene, or derivatives thereof, and a comonomer having the labile groups onto a substrate at conditions that substantially favor formation of p-xylylene copolymers. After formation of the p-xylylene copolymers, the deposited film is cured by a controlled increase in substrate temperature to convert the labile groups into microscopic gas bubbles during curing of the deposited copolymer film. The relative volume of the microscopic gas bubbles to the copolymer is controlled to maintain a closed cell foam structure that provides low dielectric constants.

The comonomers contain thermally labile groups that contain sufficient oxygen or nitrogen to form gaseous decomposition products at temperatures above about 200° C. Suitable labile groups include:

| | | |
|---|---|---|
| diazocyclopentadienyl | $-C_5H_3=N=N$ | (forms $N_2$) |
| diazoquinoyl, | $-C_6H_3=O(=N=N)$ | (forms $N_2$, CO) |
| formyloxy, and | $-O-CH=O$ | (forms CO, $H_2$) |
| glyoxyloyloxy. | $-O-CO-CH=O$ | (forms CO, $H_2$) |

The deposited copolymer film is preferably cured at a gradually increasing temperature profile to convert the labile groups to dispersed gas pockets in a nano-porous copolymer film having a low dielectric constant attributed to a closed cell foam structure. During curing the temperature of the deposited material may be increased to about 400° C. or more. Preferred nano-porous copolymer films have a dielectric constant less than about 2.0.

In a preferred gap filling embodiment, the nano-porous p-xylylene copolymer layer of the present invention is deposited on a silicon oxide-based barrier layer that was deposited on a patterned metal layer by plasma assisted reaction of one or more reactive silicon containing compounds and nitrous oxide, preferably using low levels of pulsed RF power. After curing the copolymer layer to form dispersed gas bubbles, the copolymer layer is optionally capped in the same chamber by further reaction of the reactive silicon containing compound and nitrous oxide.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE INVENTION

The present invention provides a method and apparatus for depositing a nano-porous p-xylylene copolymer layer having a low dielectric constant. The nano-porous layer is produced by condensing p-xylylene, or a derivative thereof, and a comonomer onto a substrate, the comonomer containing thermally labile groups, and by curing a resulting copolymer layer to form microscopic gas pockets that are uniformly dispersed in the copolymer layer. The relative volume of the microscopic gas pockets to the copolymer is controlled to maintain a closed cell foam structure that provides low dielectric constants and low permeability after curing. The nano-porous copolymer layers will have dielectric constants less than about 2.0.

The comonomers contain thermally labile groups that contain sufficient oxygen or nitrogen to form gaseous decomposition products at temperatures above about 300° C. Suitable labile groups include:

| | | |
|---|---|---|
| diazocyclopentadienyl | —C$_5$H$_3$=N=N | (forms N$_2$) |
| diazoquinoyl, | —C$_6$H$_3$=O(=N=N) | (forms N$_2$, CO) |
| formyloxy, and | —O—CH=O | (forms CO, H$_2$) |
| glyoxyloyloxy. | —O—CO—CH=O | (forms CO, H$_2$) |

The deposited copolymer film is preferably cured at a gradually increasing temperature profile to convert the labile groups to dispersed gas pockets in a nano-porous copolymer film having a low dielectric constant attributed to a closed cell foam structure. During curing the temperature of the deposited material may be increased to about 400° C. or more.

Preferred copolymers that comprise one or more reactive double bonds and thermally labile groups include:

bis(diazocyclopentadienylallyl)silane,
(CH$_2$=CH—CH$_2$—)$_2$—Si—(—C$_5$H$_3$=N=N)$_2$
diazoquinoylmethyldiallylsilane,
(CH$_2$=CH—CH$_2$—)$_2$—Si(CH$_3$)—C$_6$H$_3$(=O)(=N=N)
diisopropenyldiformylorthosilicate,
(CH$_2$=C(CH$_3$)—O—)$_2$—Si—(O—CH=O)$_2$
1,3-bis(allyldiazocyclopentadienylmethyl)disiloxane, diallyldiglyoxyloyloxysilane,
(CH$_2$=CH—CH$_2$—)$_2$—Si—(O—C(=O)—CH=O)$_2$
1,3-diallyltetraformyloxydisiloxane, 2,4,6,8-tetravinyltetraformyloxycyclotetrasiloxane,
(—Si(—CH=CH$_2$)(—O—CH=O)—O—)$_4$ Cyclic
cyclo-1,3,5-tris(vinylmethylsilano)-2,4,6-tris (formatomethylene), and
(—Si(—CH=CH$_2$)(—CH$_3$)—CH(—O—CH=O)—)$_3$ Cyclic
cyclo-1,3,5,7-tetra(vinylmethylsilano)-2,6-dioxy-4,8-bis (glyoxyloylmethylene).
(—Si(—CH=CH$_2$)(—CH$_3$)—O—Si(—CH=CH$_2$)(—CH$_3$)—CH(—O—C(=O)—CH=O)—)$_2$ Cyclic Such compounds polymerize to form a pliable coating layer that retains many of the labile groups at temperatures below about 40° C. A combination of two or more of the comonomers can be employed to provide a blend of desired properties such as dielectric constant, phobicity, film stress, and plasma etching characteristics.

The deposited silicon containing material is preferably cured at a gradually increasing temperature to convert the labile organic groups to dispersed gas pockets in a nano-porous layer having a low dielectric constant attributed to a closed cell foam structure.

In a preferred gap filling embodiment, the nano-porous copolymer layer of the present invention is deposited on a silicon oxide-based barrier layer that was deposited on a patterned metal layer. The silicon oxide-based barrier layer is preferably a silicon oxide-based layer deposited by plasma assisted reaction of methylsilane or dimethylsilane and nitrous oxide, preferably using low levels of constant or pulsed RF power. The nano-porous copolymer layer is then deposited in the same multichamber clustered CVD system in the absence of RF power, and is then heated using an increasing temperature profile, optionally to about 400° C. The nano-porous copolymer layer is optionally capped in the same chamber used to deposit the barrier layer by further reaction of the reactive silicon compound and nitrous oxide using low levels of constant or pulsed RF power. The liner and cap layers can serve as barriers which protect the nano-porous copolymer layer.

The liner and cap layers can be deposited by plasma assisted oxidation of the reactive silicon containing compounds. A preferred reactive silicon containing compound is dimethylsilane which is deposited using from about 10 W to about 150 W of constant RF power, or from about 20 W to about 250 W of pulsed RF power. Pulsed RF power can operate at higher peak power levels and provide the same total power input as non-pulsed RF power at a lower power level. Carbon which remains in the liner and cap layers contributes to low dielectric constants and barrier properties. The remaining carbon preferably includes sufficient C—H or C—F bonds to provide a hydrophobic layer that is a good moisture barrier.

The reactive silicon containing compounds are oxidized during deposition of the liner and cap layers by plasma assisted reaction with oxygen which is formed during the deposition process by decomposition of an oxygen containing compound such as nitrous oxide ($N_2O$). Nitrous oxide does not react without plasma assistance and the oxygen-nitrogen bonds are readily broken at lower energies than the bonds in the reactive silicon containing compounds. The oxidized compounds adhere to contacted surfaces such as a patterned layer of a semiconductor substrate to form a deposited film. The deposited films are cured at temperatures from about 300° C. to about 450° C., preferably at about 400° C. to stabilize the barrier properties of the films. The deposited film has sufficient carbon content to provide barrier properties. The carbon content preferably includes C—H or C—F bonds to provide a hydrophobic film that is an excellent moisture barrier.

Description of Preferred Embodiments

The present invention provides a method and apparatus for forming thin copolymer films having a low dielectric constant on the surface of a substrate. The copolymer film is preferably produced from p-xylylene, or a derivative thereof, in combination with a comonomer having thermally labile groups. The p-xylylene or its derivative is formed in situ by decomposition of cyclic dimer or by dehydrogenation or decomposition of a p-xylylene precursor. The p-xylylene and the comonomer will typically be introduced into the deposition chamber simultaneously.

As used herein, the term "parylene" is the generic name for thermoplastic polymers or copolymers based on p-xylylene ($CH_2$=$C_6H_4$=$CH_2$) or derivatives of p-xylylene. The p-xylylene polymers typically have the formula:

wherein n is the average number of monomer units in a molecule. Although not directly measured, n has been estimated to average about 5,000 in a typical parylene-N film, which gives the parylene-N film an estimated number average molecular weight of about 500,000. Actual molecular weights are expected to have a broad distribution and the actual molecular weights are considered to be unmeasurable. The polymer grows by addition of monomer on both ends of a p-xylylene initiator and the parylene molecules have end groups which are not easily identified. It is believed that the end groups have no influence on properties. The term "parylene" also includes chlorinated or fluorinated forms of the parylene polymers produced by halogenating the monomers or the polymers.

The typical starting material for making parylene polymers is a stable cyclic dimer, di-p-xylylene, or halogenated derivative, which is available in solid form. The dimer is typically vaporized or sublimed at a temperature between about 100 and about 200° C., and then decomposed to the reactive monomer at a temperature between about 600 and about 1000° C. for the polymerization to proceed. The dimer is commercially available from companies such as Specialty Coating, Inc. Usually the solid dimer is available in particulate form, e.g., in powder form, for ease of handling. The dimer can be used in conjunction with a packed bed or may be liquefied or dissolved in a carrier fluid to facilitate continuous delivery of the dimer.

The present invention includes forming p-xylylene or its derivatives in situ by dehydrogenation of p-xylene or its derivatives, or by decomposition of a suitable precursor, under conditions sufficient to minimize formation of side reaction products.

In one embodiment, an apparatus and method is provided for the dehydrogenation of p-xylene or its derivatives on a platinum or palladium surface having a temperature between about 400 and about 900° C. with a residence time between about 1 and 100 milliseconds. In another embodiment, the method specifically provides for continuous introduction of p-xylene and a carrier gas into a platinum or palladium lined tube operated at a total pressure from about 30 to about 500 milliTorr. The vaporized, heated p-xylene is dehydrogenated on the catalyst surface to form p-xylylene that exits the tube. The p-xylylene and an optional comonomer are then condensed onto a substrate in a vapor deposition chamber to form a parylene polymer layer having a thickness from about 0.05 micron to 10 microns.

In another alternative embodiment, p-xylylene is produced by dissociation of 1,4-bis(formatomethyl)benzene (O=CH—O—$CH_2C_6H_4CH_2$—O—CH=O) or 1,4-bis(N-methyl-aminomethyl)benzene ($CH_3NHCH_2C_6H_4CH_2NHCH_3$) by thermal decomposition or by catalytically-assisted dissociation on a platinum, palladium, or nickel surface having a temperature between about 400° C. and about 900° C. with a residence time between about 1 and 100 milliseconds. In this embodiment, dissociation can occur by pyrolytic or catalytic-assisted processes in a tube reactor. The p-xylylene and one or more comonomers are then condensed onto a substrate in a vapor deposition chamber to form a parylene copolymer layer.

In another embodiment, an apparatus and method is provided for the dehydrogenation of p-xylene in a plasma energized dehydrogenation reactor using high frequency RF power to form p-xylylene. The RF power can be from about 10 W to about 1000 W of constant RF power, or from about 20 to about 2000 W of pulsed RF power at room temperature.

Description of a Preferred Apparatus

An apparatus used to deposit the copolymer film specifically includes a deposition chamber for depositing a thin polymer layer on an object as described below. The copolymer process is preferably incorporated into a computer controlled multi-chamber integrated processing system such as the Centura™ processing system available from Applied Materials, Inc., of Santa Clara, Calif.

Figure 1:
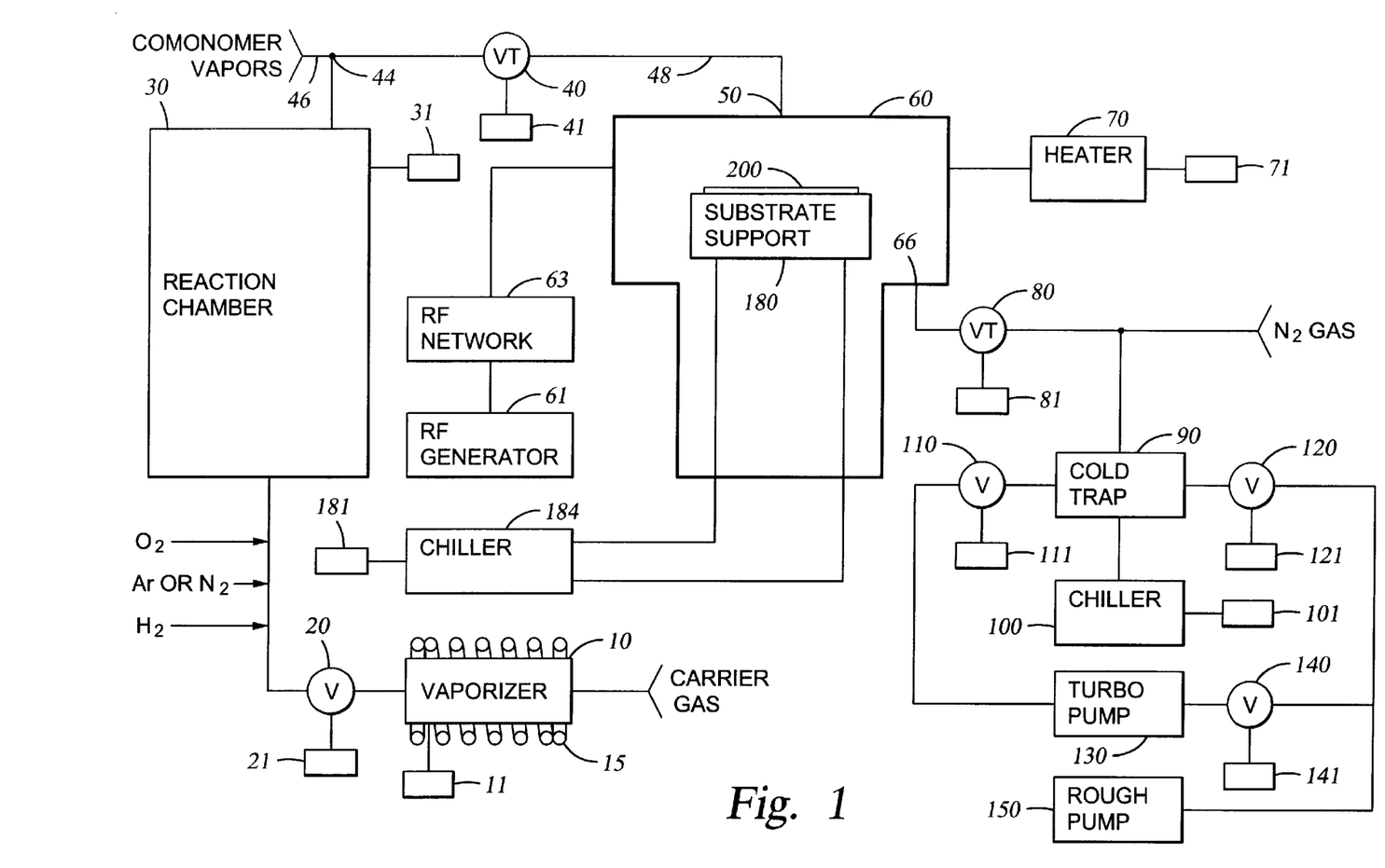
FIG. 1 is a schematic diagram of a vapor deposition apparatus of the present invention.

Referring to FIG. 1, in one embodiment, a vaporizer 10 having a heating element 15 and a power source 11 is provided to heat and vaporize a solid or liquid p-xylylene precursor such as solid cyclic dimer or liquid p-xylene. Preferred vaporizers for the liquid precursors employ liquid injection systems such as the AMAT Gas Precision Liquid Injection System (GPLIS) and the AMAT Extended Precision Liquid Injection System (EPLIS), both available from Applied Materials, Inc. The liquid injection systems vaporize precise amounts of a liquid component to provide a continuous feed of vaporized p-xylylene precursor. A carrier gas such as helium can also be used to control the residence time of the solid or liquid precursor in the vaporizer. An external heat controller 11, such as a Watlow 965 Temperature Controller, may be used.

The vaporized precursor, or optional mixture of vaporized precursor and a carrier gas, then passes from vaporizer 10 through a gate valve 20 to a reaction chamber 30 where the vaporized p-xylylene precursor is substantially decomposed or dehydrogenated to form p-xylylene, or a derivative thereof. An additional source of a carrier gas such as argon or nitrogen is provided prior to the reaction chamber 30 to control the flow rate of the precursor. Also, sources of oxygen and hydrogen are provided for cleaning and conditioning of the reaction chamber as discussed below.

The pressure in vaporizer 10 may be maintained at atmospheric pressure. However, the entire apparatus (vaporization 10, reaction chamber 30, and deposition chamber 60) is preferably maintained at a pressure from about 30 milliTorr to about 500 milliTorr. The increase in total pressure up to a range from about 200 milliTorr to about 500 milliTorr increases the deposition rate of the polymers and allows better control of the amount of monomer or polymer that is provided to the deposition chamber. The carrier gas can be any inert gas, preferably helium, argon, or nitrogen.

The temperature of vaporizer 10, when operated within the previously described pressure ranges, will usually vary from a minimum temperature below which the xylene will not vaporize, at the vaporizer pressure, up to a maximum temperature below the temperature at which the vaporized material will decompose at the vaporizer pressure. While the operating temperature of the vaporizer will vary according to the precursor material to be vaporized, the temperature is preferably maintained between about 100° C. and about 200° C.

Figure 4:
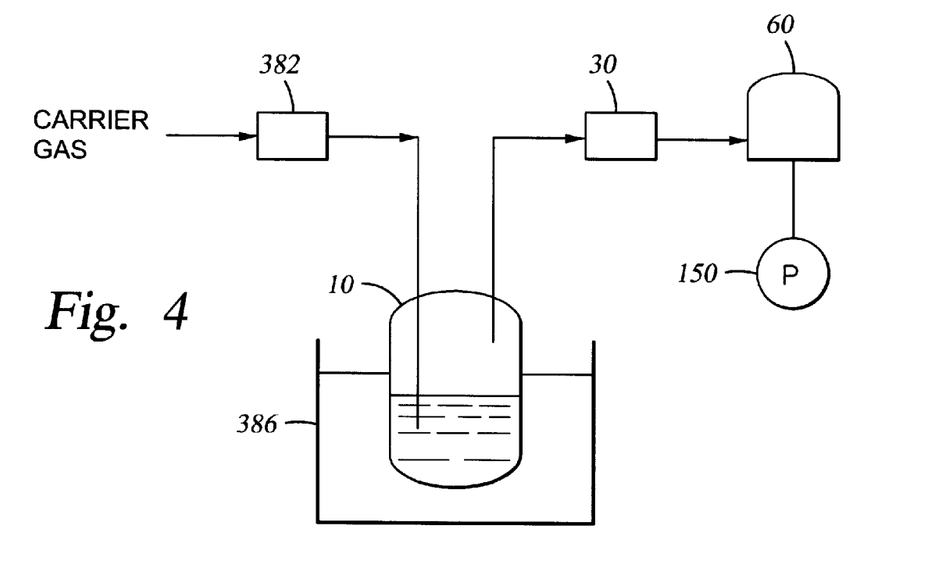
FIG. 4 is a schematic view of a carrier gas delivery system for transporting a p-xylylene liquid precursor through a dehydrogenation reactor to a deposition chamber.

An alternative embodiment for the vaporizer 10 is shown in FIG. 4 wherein a thermostatic oven 386 heats the vaporizer 10 which contains, for example, non-vaporized precursor and vaporized precursor. The carrier gas is passed through a flow controller 382 such as a metering pump or a needle valve and is bubbled through the non-vaporized precursor in the vaporizer 10. The combined carrier gas and vaporized precursor are then passed to the reaction chamber 30 and a deposition chamber 60 by a rough pump 150. A mass flow meter (not shown) can be placed anywhere between the vaporizer 10 and the deposition chamber 60 to measure the total mass leaving the vaporizer 10. The flow rate of precursor can then be calculated by subtracting the mass of carrier gas sent to the vaporizer 10.

Figure 2:
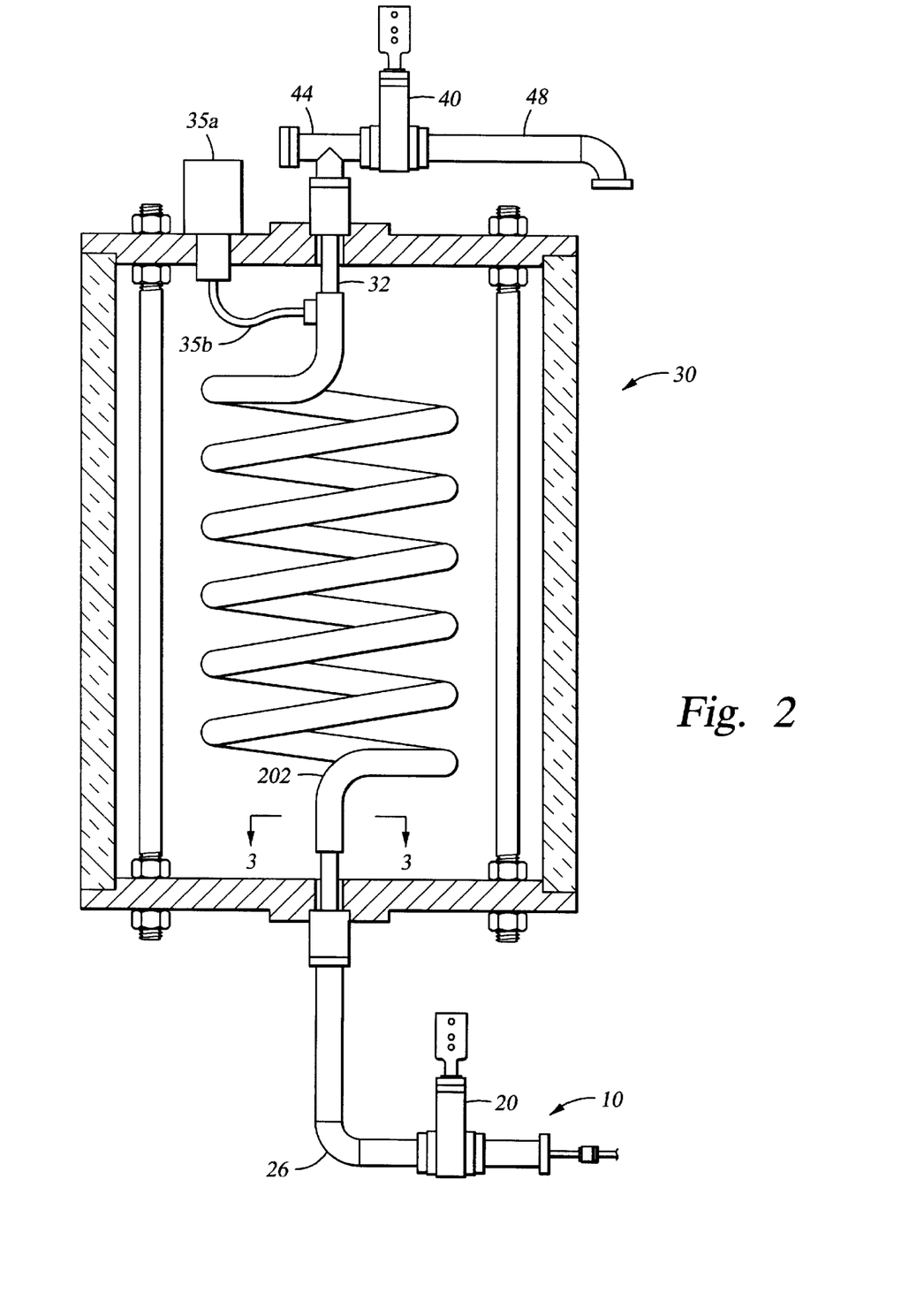
FIG. 2 is a partially sectioned view of a portion of the apparatus of FIG. 1, showing a dehydrogenation reactor of the present invention.

Referring to FIGS. 1 and 2, a first valve 20 following the vaporizer 10 may be manually operated, but preferably will be automatically operated and connected to a valve controller 21 which will sense the temperature and pressure in vaporization chamber 10 and open valve 20 only after vaporization chamber 10 has reached a temperature at which the polymerizable material will vaporize so that gases flowing from vaporization chamber 10 through the first valve 20 will contain vaporized polymerizable material, as well as the optional non-reactive carrier gases flowing through vaporization chamber 10.

A metal conduit 26 connecting the vaporizer 10 to the reaction chamber 30 is preferably heated by an external heater such as heating tape wrapped around conduit 26 to maintain the vaporized precursor at a temperature sufficiently high so that it will not begin to condense. Typically, this will be a temperature of at least about 120° C.

The p-xylylene precursor is decomposed or dehydrogenated in the reaction chamber 30 as described below for several embodiments. The gas/vapor flow containing p-xylylene or a derivative thereof then passes out of the reaction chamber 30 to a tee 44 where the xylylene vapors are blended with a comonomer in vaporized form from conduit 46 (shown in FIG. 1). The comonomer is vaporized from solid or liquid compounds as described for p-xylylene. The vaporized p-xylylene and comonomer then flow through a second gate valve 40 to a conduit 48 which connects valve 40 with an entrance port 50 to a substrate processing chamber 60. The monomers condense and polymerize on an object therein, such as a semiconductor substrate, which is preferably temperature controlled by a support member 180 that is connected to a chiller 184. Condensation of the monomers typically occurs at a temperature between about −30 and about 30° C.

It is preferred that the walls of deposition chamber 60 be maintained at a sufficiently high temperature to prevent deposition and polymerization of the vaporized polymerizable material. In one embodiment, the chamber wall temperature is maintained by a heater 70, under the control of heater controller 71. The remaining gas/vapor mixture then passes from the deposition chamber 60 through a throttle valve 80, under the control of valve controller 81, which regulates the pressure in chamber 60, and then passes through a cold trap 90 connected to a chiller 100. The remaining gases then pass through a gate valve 120, controlled by valve controller 121, to a rough pump 150. It is anticipated that the chamber walls may be heated by any other heating means.

It should be noted that, in accordance with the invention, the substrate 200 is preferably processed in a closed system. Thus, after the deposition, the substrate may be removed from the deposition chamber 60, placed in a storage area in a load lock chamber between processing chambers, and allowed to reach ambient temperature. This permits the substrate to reach ambient temperature without either exposing the substrate to the ambient atmosphere during the warm-up (which would result in unacceptable moisture pickup), or leaving the coated substrate in the deposition chamber to warm up (which would reduce the throughput rate in the parylene deposition chamber). Alternatively, the substrate may be moved from the load lock chamber to other chambers for subsequent processing without removing the substrate from the vacuum environment, e.g., moved to another chamber for PECVD formation of a silicon dioxide ($SiO_2$) film thereon.

Figure 3:
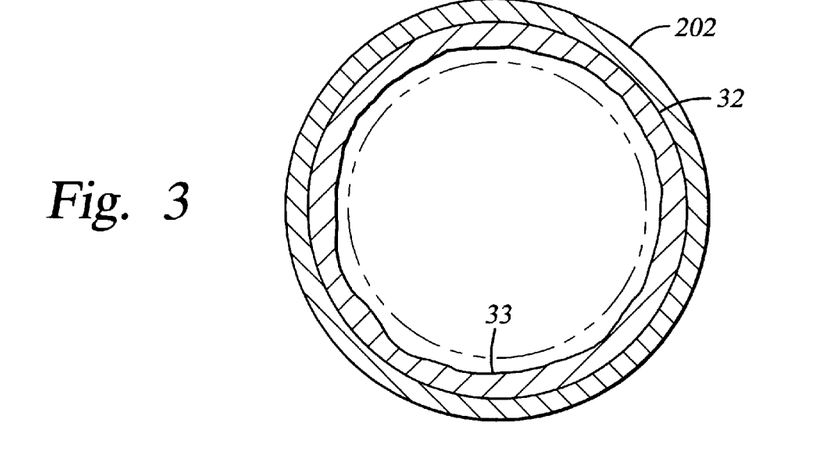
FIG. 3 is a horizontal cross-sectional view of a dehydrogenation reactor tube shown in FIG. 2.

A preferred reaction chamber 30 is shown in FIGS. 2 and 3. While a dehydrogenation or pyrolytic decomposition reactor may be constructed in many ways, it is preferred that the reactor have a large surface area to heat the vaporized material rapidly and evenly and a short residence time to minimize formation of dimers. In FIG. 2, the reaction chamber 30 comprises a helical tube 32 that is connected, via conduit 26, to the first gate valve 20. The helical tube 32 has a platinum or palladium inner surface 33 for dehydrogenation of p-xylene, or derivatives thereof, and can be constructed from either metal. Catalytic metals can also be used for pyrolytic dissociation. The inner surface 33 is preferably roughened to increase contact with the p-xylene precursor as shown in FIG. 3. Alternatively, the reaction chamber 30 can be constructed by electroplating the inner surface of a nickel or molybdenum tube (e.g., 0.5 inch OD, 6 ft. length) with platinum or palladium, followed by winding the tube into a helical configuration.

Surrounding the helical tube 32 is a heating tape 202, or ceramic heating furnace with an inner cavity, having heater wires embedded therein, to heat the helical tube 32. The heater wires of the heating tape 202 or ceramic furnace are connected to an external power supply 35a by a wire 35b, to a temperature controller 31, and to computer control means 340 to maintain a temperature between about 400° C. and about 900° C. preferably about 650° C. A temperature above 500° C. and preferably above about 600° C., is necessary to assure sufficient dehydrogenation of the xylene, while minimizing formation of side reaction products.

Figure 5:
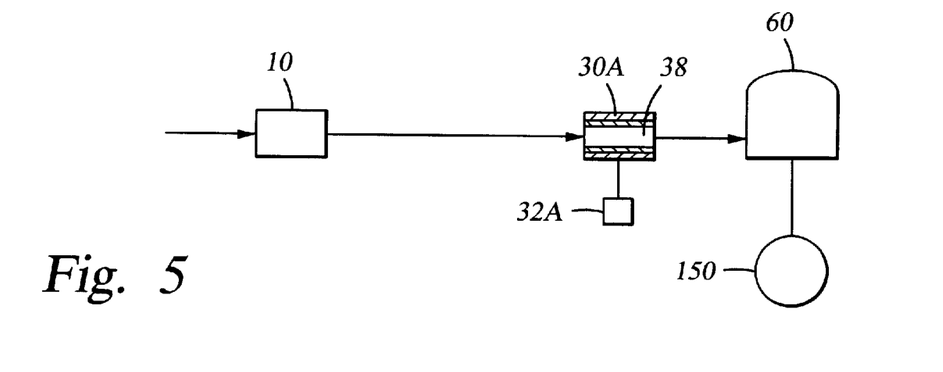
FIG. 5 is a vertical cross-sectional view of an alternate structure for the dehydrogenation reactor of FIG. 1.

Referring now to FIG. 5, an alternative reaction chamber 30A employs a microwave applicator 32A that couples RF power to a p-xylene precursor such as p-xylene. The precursor passes through an RF transparent tube 38, e.g. $Al_2O_3$ or $SiO_2$, enclosed within a microwave cavity 38A. RF energy is fed to the microwave cavity and a plasma discharge forms in the tube 38. The RF power source preferably provides high frequency RF power (e.g. about 13 to about 14 MHz) to input from about 10 W to about 1000 W of constant RF power or about 20 W to about 2000 W of pulsed RF power to the vaporized precursor introduced into reaction chamber 30 prior to entering the deposition chamber 60.

It is preferred that the reaction chamber 30 provides a residence time of about 1 to about 100 milliseconds to avoid excessive decomposition. After deposition, the reaction chamber is preferably swept with nitrogen, argon, or helium to prevent excessive precursor residence time within the reaction chamber 30. Periodically, between film depositions, the reaction chamber can be treated with flowing oxygen to remove any coking deposits.

As further shown in FIGS. 1 and 2, the gases flowing from the reaction chamber 30 pass into a metal tee 44, wherein the reactive p-xylylene gases may be optionally blended with the comonomer, i.e., monomers or dimers with which the reactive parylene monomers will react and polymerize in the deposition chamber, as will be described below. A second gate valve 40, which is operated by valve controller 41 and computer control means 340 to control the flow of vapors into deposition chamber 60.

Tee 44, like flanged metal conduit 26, is preferably heated by an external heater such as heating tape wrapped around tee 44 to maintain the reactive monomer at a temperature sufficiently high so that it will not begin to polymerize. Usually this will comprise a temperature of at least about 150° C. When a copolymerizable source is used, a second vaporization chamber, similar to the previously described vaporization chamber 10, can be used to vaporize the copolymerizable material. The apparatus used to provide such a copolymerizable material in gaseous form may then be connected to tee 44 to thereby permit the respective gaseous reactive copolymerization sources to blend together in tee 44 prior to introduction into deposition chamber 60.

For the copolymer films of the present invention, the amount of comonomer blended with the gaseous flow of p-xylylene monomer may range up to about 25 molecular %. The amount of comonomer added is adjusted based upon the particular comomoners used and optimization of film properties.

The deposition chamber 60 is preferably configured for use on an integrated platform for processing integrated circuits. Such an integrated platform is described in Maydan et al., U.S. Pat. No. 4,951,601, the disclosure of which is hereby incorporated by reference. For parylene deposition, internal surfaces of the chamber 60 are maintained or a temperature above the polymerization temperature of the reactive parylene monomer, i.e., at a temperature above 100° C., but below a temperature at which further decomposition of the reactive monomer might occur, i.e., at a temperature below about 750° C. Typically, the temperature of the chamber 60 will be maintained within a range of from about 100° C. and about 300° C.

Figure 6:
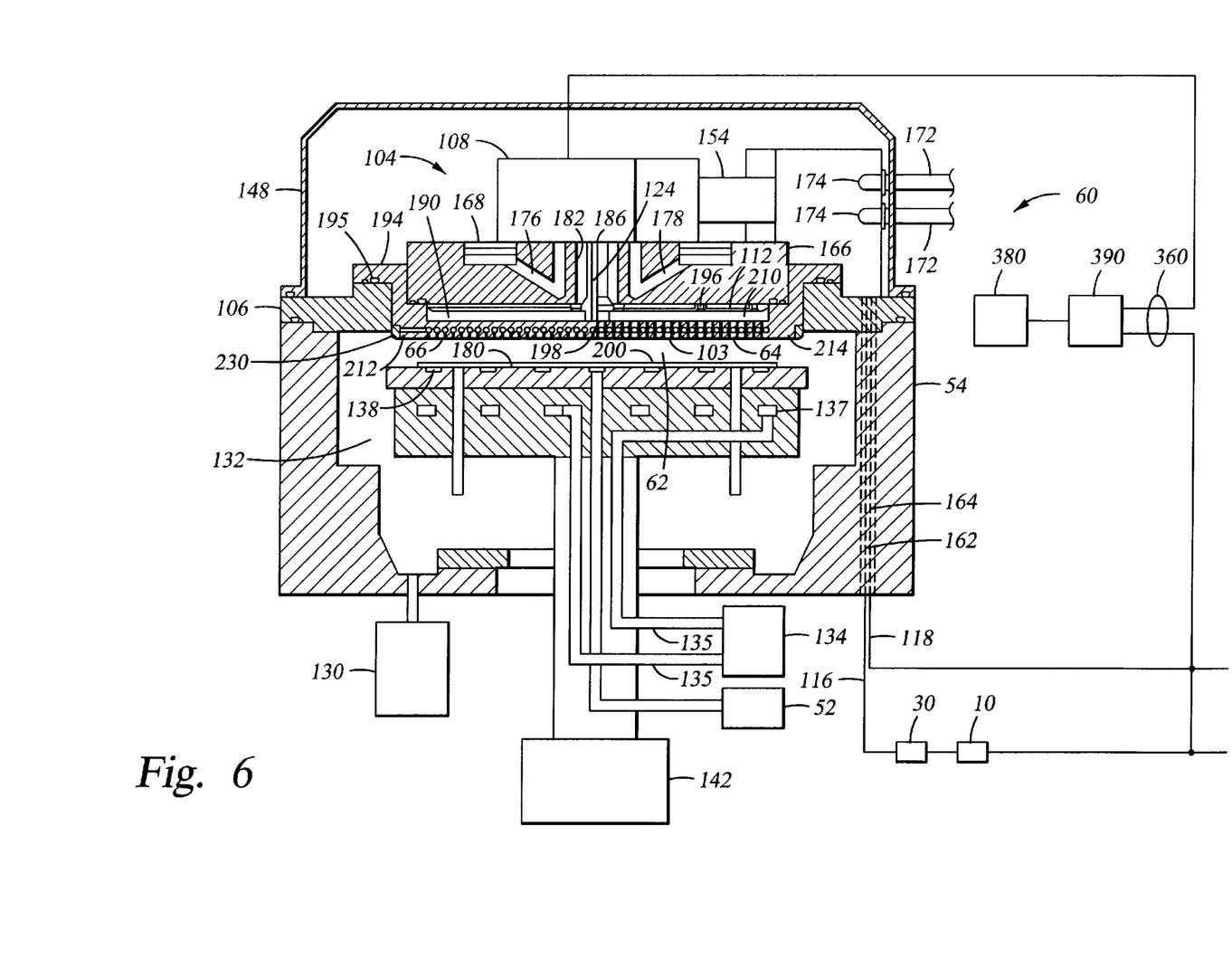
FIG. 6 is a cross-sectional diagram of an exemplary CVD processing chamber used according to one embodiment of the present invention.

FIG. 6 shows a cross sectional view of one embodiment of a processing chamber 60, incorporating the present invention. The chamber 60 generally includes a chamber body 54, enclosing a processing region 62, wherein chemical precursors are introduced during processing. A vertically movable temperature-controlled substrate support member 160 is disposed through a lower end of the chamber body 54 to support a substrate 200 thereon. The substrate support member 160 includes a cooling channel 137, through which a fluid is passed to effect heating and/or cooling of the support member 160. An annular vacuum exhaust channel 132, connected to a vacuum pump 130, is provided to expel process gases from the process region 62. A top gas distribution assembly 104 is disposed on a lid 106 to deliver gases into the chamber 60. The gas distribution assembly 104 comprises a gas feedthrough 108, a gas injection cover plate 170, a blocker plate 112, and a multi-channel faceplate 200. The faceplate 103 is shown incorporated into the chamber 60 as part of the gas distribution assembly 104, so that the faceplate 103 defines the upper limit of the processing region 62. The lid 106 mounts the faceplate 103 and supports the gas injection cover plate 170. O-rings 195, located in a flange 194, provide a seal between the flange 194 of the faceplate and the lid 106. A cover 148 is disposed over the lid 106. The faceplate 103, described in detail below, is uniquely designed to separately deliver a first and a second precursor gas into the processing region 62 via gas channels. In general, the channels comprise a set of vertical and horizontal channels formed in the faceplate 103 as described in more detail in copending U.S. Provisional Application No. 60/089,413 [AMAT 2829], filed Jun. 16, 1998, which description is incorporated by reference herein.

The faceplate 103 includes a top surface 210, a bottom surface 212, and a peripheral annular portion, or sidewall 214. A first gas pathway includes a first set of vertical channels 64, which channels extend through the faceplate 103 to provide fluid communication between an upper region 190, adjacent the top surface 210, and lower region 235, adjacent the bottom surface 212, where an upper limit of the upper region 190 is defined by the gas injection cover plate 166, shown in FIG. 6. A second gas pathway includes a second set of vertical channels 66, which provide fluid communication between horizontal channels and the processing region 62. A central gas inlet, or nozzle 224, disposed perpendicularly through the top surface 210 is in horizontal channels and is received by a lower portion of a conduit 184, shown in FIG. 6. An annular ring 230, adapted to fit circumferentially abut the sidewall 214, hermetically seals the endpoints of the set of horizontal channels 222. To help ensure an airtight seal, the ring 230 and the sidewall 214 may be fused together. Alternatively, the endpoints of the horizontal channels 222 may be individually plugged.

The faceplate 103 is preferably monolithic, i.e., machined or otherwise fabricated as a single piece of material, where the size and spacing of the holes may be varied according to the particular application, so that uniform delivery into the process chamber is achieved. Manufacturing the faceplate as a single piece of material avoids the problems encountered with aligning separate plates and prevents leakage of gases between plates.

The gas feedthrough 108, mounts the gas injection plate 166 and comprises an inlet manifold 150, an outlet manifold 152, and a housing 154 interposed therebetween. Gas delivery tubes extend through the housing 154 to separately route two process gases therethrough. The gas delivery channels are connected to a first monomer supply line 116 from the reaction chamber 30 and second monomer supply line 118, respectively, at the bottom of the chamber body 54.

The gas feedthrough 108 circulates a heat transfer fluid through an annular fluid passageway 180 formed in the gas injection cover plate 160 via coolant fluid inlet channel 176 and a coolant fluid outlet channel 178 that communicate with fluid lines 172 connected to fluid ports 174.

A central bore 182, disposed through the gas injection cover plate 160, houses a coaxially disposed gas conduit 184, which delivers a gas to second gas pathway 216, which includes the second set of horizontal channels 222. The conduit 184 channels a second gas into the nozzle 224 which is received at a lower end of the conduit 184. The central bore 182 and the perimeter of the conduit 184 define a gas delivery passage 186, which delivers a gas above the blocker plate 112 and into the first set of vertical channels. The perforated blocker plate 112, suspended by screws 196, is horizontally disposed within the upper region 190. The blocker plate 112 is perpendicularly intersected by the gas conduit 184, which traverses the upper region 190 and terminates near the top surface 210, so that the conduit 184 and the top surface 210 are in mating abutment and hermetically sealed by an O-ring 198.

FIG. 6 also shows a remote cooler 184 connected to the substrate support member 160 by coolant lines 135. A liquid coolant such as water, ethylene, glycol, or the like is delivered to the substrate support member 180, circulated through a spiraling cooling channel 137, and then circulated back to the cooler 184. The circulation of the fluid allows the temperature of the substrate support member 160 to be controlled by a chiller controller 181. To ensure a highly efficient heat exchange, the substrate support member 160 is preferably made of aluminum, because of its excellent thermal conductive properties as well as its resistance to the corrosive effects of the chemical precursors. FIG. 6 shows a plurality of grooves 138 formed in the substrate seating surface 180. A substrate backside vacuum is achieved by attaching a vacuum pump 52 to the substrate support member 160 in communication with the grooves 138.

Generally, the process gases supply lines for each of the process gases include (i) safety shut-off valves (not shown) that can be used to automatically or manually shut-off the flow of process gas into the chamber, and (ii) mass flow controllers (also not shown) that measure the flow of gas through the gas supply lines. When toxic gases are used in the process, the several safety shut-off valves are positioned on each gas supply line in conventional configurations.

In operation, the substrate 200 is positioned onto the substrate support member 160 by a an external robot (not shown). A first gas is then routed through the first vertical passages 64, while the second gas is routed through the second vertical passages 66. The first gas is delivered into the upper region 190, above the blocker plate 112. The blocker plate 112 acts as an initial dispersion stage, forcing the first gas to pervade upper region 190 and diffuse over the upper surface of the blocker plate 112. The first gas then migrates through perforations in the blocker plate 112, uniformly impinges on the top surface 210, and ultimately migrates through the first and second vertical channels 64, 66.

Where the desired polymer is to be formed on the substrate 200 such as parylene, the substrate support 160 should be maintained at a temperature below the condensation temperature of the monomer, e.g. for p-xylylene the substrate support 160 should not exceed about 40° C., and preferably within a range of from about −30° C. to about +30° C., using chiller 184, under control of chiller controller 181. When the gaseous mixture contacts the cooled surface of, for example, semiconductor substrate 200, polymerization of the reactive p-xylylene monomers commences, as well as copolymerization with other reactive polymerizable materials (if present) resulting in the formation of the desired dielectric film of parylene or parylene copolymer on the surface of the substrate, e.g., on the surface of semiconductor substrate 200.

Referring to FIG. 1, to prevent deposition of parylene films on the chamber walls, the heater 70 preferably provides a heat exchange fluid, such as a 1:1 mixture by weight of ethylene glycol and deionized water, through passages (not shown) in the chamber sidewalls.

Typically, any or all of the chamber lining, gas inlet manifold faceplate, and various other reactor hardware is made out of material such as aluminum or anodized aluminum. An example of such a CVD apparatus is described in U.S. Pat. No. 5,000,113, entitled "Thermal CVD/PECVD Reactor and Use for Thermal Chemical Vapor Deposition of Silicon Dioxide and In-situ Multi-step Planarized Process," issued to Wang et al, and assigned to Applied Materials, Inc., the assignee of the present invention. The disclosure of the '113 patent is incorporated by reference.

Gas flows and RF power supply 61 are controlled by the computer control means 340 over control lines 360. The chamber includes analog assemblies such as mass flow controllers (MFCs) and RF generators that are controlled by the control means 340 which executes system control software stored in a memory 380, preferably a hard disk drive.

Now referring to FIG. 1, after the mixture of vaporized monomers and optional carrier gases flow into chamber 60, a parylene copolymer, for example, is deposited on the surface of substrate 200 by condensation and polymerization of the reactive p-xylylene monomers and a multivinyl silicon comonomer. The monomers polymerize on the surface of the substrate at different rates depending on the relative concentrations and relative polymerization reaction rates of the monomers. The remainder of the optional carrier gases, and any remaining unreacted monomer vapors, then pass out of chamber 60 (see FIG. 7) and then through a throttle valve 80 to a cold trap 90. The purpose of throttle valve 80 is to maintain the desired pressure within chamber 60. The deposition/polymerization reaction is usually carried out while maintaining a pressure within deposition chamber 60 of from about 30 milliTorr to about 0.5 Torr. When the monomer is p-xylylene, the pressure in the chamber 60 is maintained between 30 mTorr and 0.5 Torr since a pressure above about 0.5 Torr will result in deposition of a lower crystallinity film. When the pressure in deposition chamber 60 deviates from the set pressure, throttle valve 80, which is connected to a pressure sensor, either opens to cause the pressure to drop, or closes to cause the pressure to rise.

Figure 7:
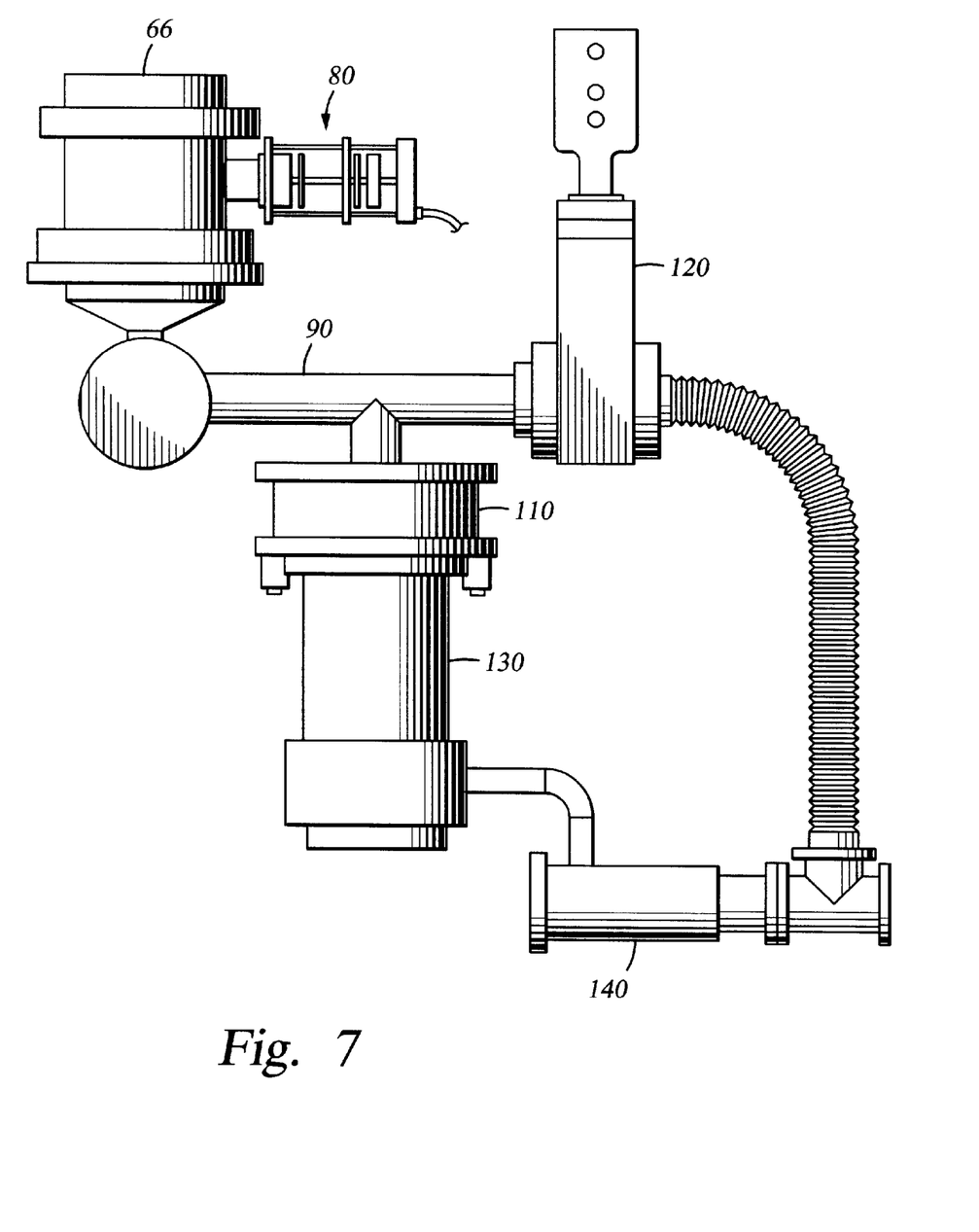
FIG. 7 is a vertical cross-sectional view of a portion of the apparatus generally shown in FIG. 1, showing the processing of gases/vapors exiting from the processing chamber.

Now referring to FIG. 7, throttle valve 80 may be modified, if desired, to permit a non-reactive gas, e.g., argon, helium, or nitrogen, to be added to the gaseous stream flowing from chamber 60 through throttle valve 80 to cold trap 90. Typically, this additional gas flow into cold trap 90 will comprise a flow of about 50 standard cubic centimeters per minute (sccm), depending on the chamber volume under the control of controller 340. The purpose of the added non-reactive gases is to control the flow of the gaseous stream of carrier gas and reactive monomer through deposition chamber 60, i.e., to control the residence time, to permit more complete extraction of the heat from the gaseous stream flowing through chamber 60 and to provide for more complete reaction of the polymerization, i.e., to further minimize the amount of unreacted polymerizable material leaving chamber 60 via exit port 66 which must be extracted in cold trap 90.

The vapors and gases passing through throttle valve 80 then enter cold trap 90 which, in turn, is connected to a vacuum pump 150 (see FIG. 1) which is capable of maintaining chamber 60 at subatmospheric pressure. It is important, however, that unreacted monomer and other copolymerizable materials not enter vacuum pump 150, but rather be removed from the gas stream in cold trap 90. Cold trap 90 may comprise any conventional commercial cold trap, such as, for example, a standard Norcal cold trap, which is connected to the downstream side of throttle valve 80 to trap and remove any monomers or polymers from the gas stream.

Connected to the downstream side of cold trap 90 is gate valve 120 through which the remaining gases in the gas stream pass to rough vacuum pump 150 to maintain the desired low pressure. As shown in FIGS. 1 and 10, cold trap 90 is also connected through gate valve 110 to a turbo pump 130 and then through an isolation valve 140 to rough vacuum pump 150. When chamber 60 is used as a deposition chamber, such as for the previously discussed polymeric deposition of reactive p-xylylene monomer, valves 110 and 140 are shut and valve 120 is opened to connect rough vacuum pump directly to cold trap 90. However, if the same chamber is to be used as a plasma etch chamber or for any other processing requiring high vacuum, such as for in situ plasma cleaning of the chamber, as previously discussed, gate valve 120 may be shut off and both gate valve 110 and isolation valve 140 opened to place high vacuum turbo pump 130 in the stream between cold trap 90 and rough vacuum pump 150.

To clean the processing chamber 60 following deposition of reactive monomer, oxygen can be introduced into the chamber at a rate of 100–1000 sccm and an RF bias of 750–1200 watts applied to the support member to effectuate cleaning of the chamber.

Referring to FIG. 6, the computer controller 340 controls all of the activities of the CVD chamber and a preferred embodiment of the controller 340 includes a hard disk drive, a floppy disk drive, and a card rack. The card rack contains a single board computer (SBC), analog and digital input/output boards, interface boards and stepper motor controller boards. The system controller conforms to the Versa Modular Europeans (VME) standard which defines board, card cage, and connector dimensions and types. The VME standard also defines the bus structure having a 16-bit data bus and 24-bit address bus. The controller 340 operates under the control of a computer program stored on the hard disk drive 380. The computer program dictates the timing, mixture of gases, RF power levels, substrate support member, and other parameters of a particular process. The interface between a user and the system controller is typically via a CRT monitor and light pen.

Figure 8:
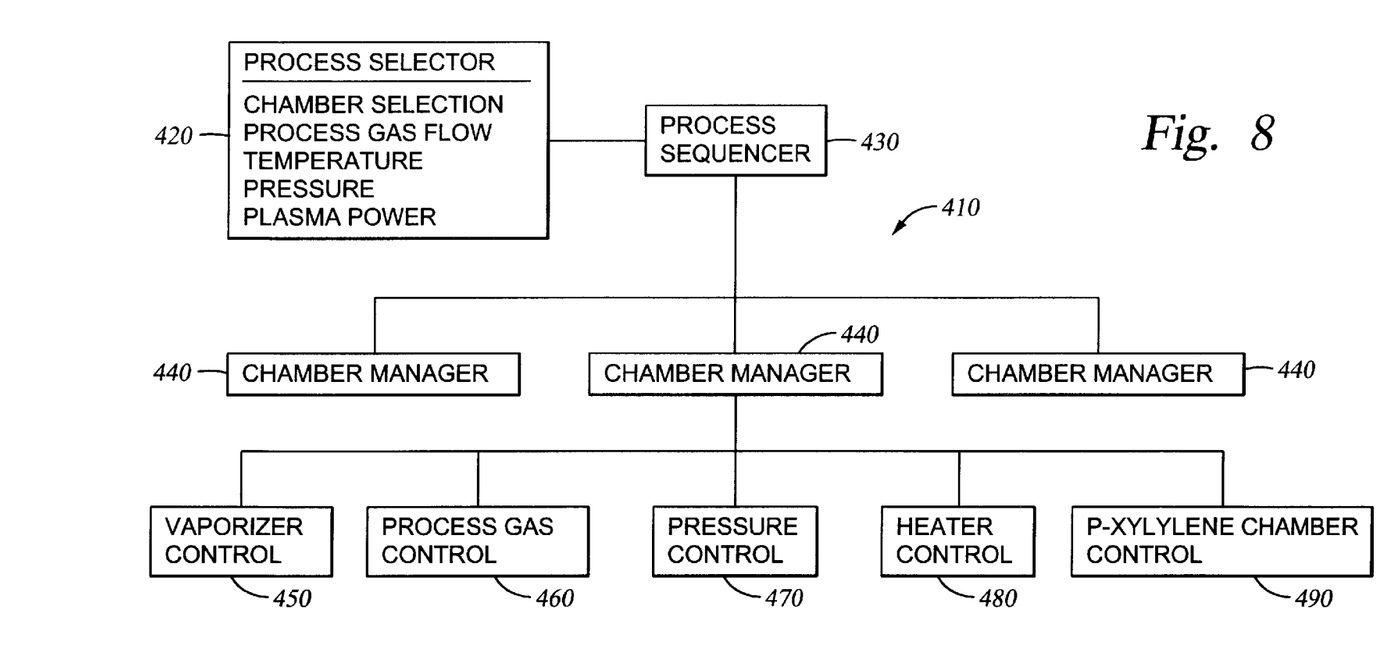
FIG. 8 is a flowchart of a computer program used for process control in conjunction with the exemplary apparatus of FIGS. 1–7.

The process can be implemented using a computer program product 400 that runs on, for example, the computer controller 340. The computer program code can be written in any conventional computer readable programming language such as for example 68000 assembly language, C, C++, or Pascal. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled windows library routines. To execute the linked compiled object code, the system user invokes the object code, causing the computer system to load the code in memory, from which the CPU reads and executes the code to perform the tasks identified in the program.

FIG. 8 shows an illustrative block diagram of the hierarchical control structure of the computer program 400. A user enters a process set number and process chamber number into a process selector subroutine 420 in response to menus or screens displayed on the CRT monitor by using the lightpen interface. The process sets are predetermined sets of process parameters necessary to carry out specified processes, and are identified by predefined set numbers. The process selector subroutine 420 identifies (i) the desired process chamber, and (ii) the desired set of process parameters needed to operate the process chamber for performing the desired process. The process parameters for performing a specific process relate to process conditions such as, for example, process gas composition and flow rates, temperature, pressure, plasma conditions such as RF bias power levels and magnetic field power levels, cooling gas pressure, and chamber wall temperature and are provided to the user in the form of a recipe.

The signals for monitoring the process are provided by the analog input and digital input boards of the control means 340 and the signals for controlling the process are output on the analog output and digital output boards of the control means 340.

A process sequencer subroutine 430 comprises program code for accepting the identified process chamber and set of process parameters from the process selector subroutine 420, and for controlling operation of the various process chambers. Multiple users can enter process set numbers and process chamber numbers, or a user can enter multiple process set numbers and process chamber numbers, so the sequencer subroutine 430 operates to schedule the selected processes in the desired sequence. Preferably the sequencer subroutine 430 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such a polling. When scheduling which process is to be executed, the sequencer subroutine 430 can be designed to take into consideration the present condition of the process chamber being used in comparison with the desired process conditions for a selected process, or the "age" of each particular user entered request, or any other relevant factor a system programmer desires to include for determining scheduling priorities.

Once the sequencer subroutine 430 determines which process chamber and process set combination is going to be executed next, the sequencer subroutine 430 causes execution of the process set by passing the particular process set parameters to one of several chamber manager subroutines 440 which controls multiple processing tasks in a process chamber 60 according to the process set determined by the sequencer subroutine 430. The chamber manager subroutine 440 controls execution of various chamber component subroutines which control operation of the chamber components necessary to carry out the selected process set including the vaporizer 10, reaction chamber 30, and cold trap 90. Examples of chamber component subroutines are vaporizer control subroutine 450, process gas control subroutine 460, pressure control subroutine 470, heater control subroutine 480, and p-xylylene chamber control subroutine 490. Those having ordinary skill in the art would readily recognize that other chamber control subroutines can be included depending on what processes are desired. In operation, the chamber manager subroutine 440 selectively schedules or calls the process components subroutines in accordance with the particular process set being executed. The chamber manager subroutine 440 schedules the process component subroutines similarly to how the process sequencer 430 schedules which process equipment and process set is to be executed next. Typically, the chamber manager subroutine 440 includes steps of monitoring the various chamber components, determining which components needs to be operated based on the process parameters for the process set to be executed, and causing execution of a chamber component subroutine responsive to the monitoring and determining steps.

The process gas control subroutine 460 has program code for controlling process gas composition and flow rates. The process gas control subroutine 460 controls the open/close position of the safety shut-off valves, and also ramps up/down the mass flow controllers to obtain the desired gas flow rate. The process gas control subroutine 460 is invoked by the chamber manager subroutine 440, as are all chamber component subroutines, and receives from the chamber manager subroutine process parameters related to the desired gas flow rates. Typically, the process gas control subroutine 460 operates by opening the gas supply lines, and repeatedly (i) reading the necessary mass flow controllers, (ii) comparing the readings to the desired flow rates received from the chamber manager subroutine 440, and (iii) adjusting the flow rates of the gas supply lines as necessary. Furthermore, the process gas control subroutine 460 includes steps for monitoring the gas flow rates for unsafe rates, and activating the safety shut-off valves when an unsafe condition is detected.

An inert gas such as argon is preferably flowed into the chamber 60 to stabilize the pressure in the chamber before reactive process gases are introduced into the chamber. For these processes, the process gas control subroutine 460 is programmed to include steps for flowing the inert gas into the chamber 60 for an amount of time necessary to stabilize the pressure in the chamber, and then the steps described above would be carried out. Additionally, when the process gas is to be generated in the vaporizer 10, for example di-p-xylylene, the process gas control subroutine 460 can be written to obtain the carrier flow from the vaporizer control subroutine 450.

The pressure control subroutine 470 comprises program code for controlling the pressure in the chamber 60 by regulating the size of the opening of the throttle valve 80 in the exhaust system of the chamber. The size of the opening of the throttle valve 80 is set to control the chamber pressure to the desired level in relation to the total process gas flow, size of the process chamber, and pumping set point pressure for the exhaust system. When the pressure control subroutine 470 is invoked, the desired, or target, pressure level is received as a parameter from the chamber manager subroutine 440. The pressure control subroutine 470 operates to measure the pressure in the chamber 60 by reading one or more conventional pressure manometers connected to the chamber, compare the measure value(s) to the target pressure, obtain PID (proportional, integral, and differential) values from the stored pressure table corresponding to the target pressure, and adjust the throttle valve 80 according to the PID values obtained from the pressure table. Alternatively, the pressure control subroutine 470 can be written to open or close the throttle valve 80 to a particular opening size to regulate the chamber 60 to the desired pressure.

The heater control subroutine 480 comprises program code for controlling the temperature of the chamber 60. The heater control subroutine 480 is invoked by the chamber manager subroutine 440 and receives a target, or set point, temperature parameter. The heater control subroutine 480 measures the temperature by measuring voltage output of thermocouple located in the chamber 60, compares the measured temperature to the set point temperature, and increases or decreases current applied to the lamp module 260 and other heating components to obtain the set point temperatures. The temperature is obtained from the measured voltage by looking up the corresponding temperature in a stored conversion table, or by calculating the temperature using a fourth order polynomial.

The above CVD system description is mainly for illustrative purposes, and other CVD equipment may be employed. Additionally, variations of the above described system such as variations in substrate support design, heater design, location of RF power connections and others are possible.

The invention is further described by the following hypothetical examples which describe specific embodiments and are not intended to limit the scope of the invention.

Figure 9:
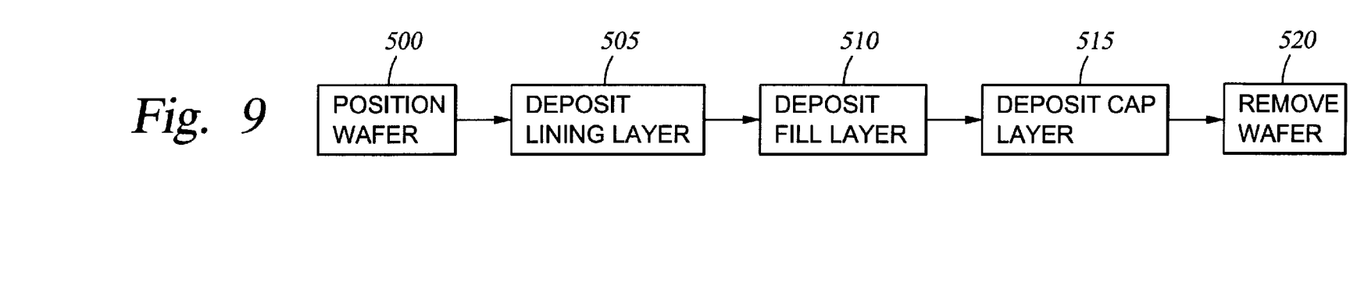
FIG. 9 is a flow chart illustrating steps undertaken in depositing a p-xylylene layer and liner and cap layers in a process according to one embodiment of the present invention.

Deposition of a Nano-Porous Copolymer Layer in a Three-Layer Gap Filling Process The nano-porous copolymer layer of the present invention can be used in a three-layer gap filling process as shown in FIG. 9. Referring to FIG. 9, a wafer is positioned 500 in a deposition chamber and a silicon oxide-based layer is deposited 505 by a PECVD process from a plasma comprising a reactive silicon containing compound such as dimethylsilane and nitrous oxide. The deposition step 505 can include a capacitively coupled plasma or both an inductively and a capacitively coupled plasma according to methods known in the art. An inert gas such as helium is commonly used in the PECVD deposition to assist in plasma generation. A nano-porous copolymer layer of the present invention is then deposited as a fill layer 510 on the liner layer by condensing p-xylylene, or a derivative thereof, and a comonomer containing labile groups, and by controlled curing of the deposited copolymer layer to form microscopic gas pockets that are uniformly dispersed in the fill layer. A cap layer is then deposited 515 on the copolymer layer, preferably using the same process for depositing the lining layer. The wafer is then removed 520 from the deposition chambers.

Referring to FIGS. 10A–10E, the three-layer gap filling process provides a PECVD lining layer 300 of the oxidized reactive silicon containing compound. The lining layer 300 acts as an isolation layer between the subsequent nano-porous copolymer layer 302 and the underlying substrate surface 304 and metal lines 306, 308, 310 formed on the substrate surface. The nano-porous copolymer layer 302 is capped by a PECVD capping layer 312 of the oxidized reactive silicon containing compound. This process is implemented and controlled using a computer program.

Figure 10A:
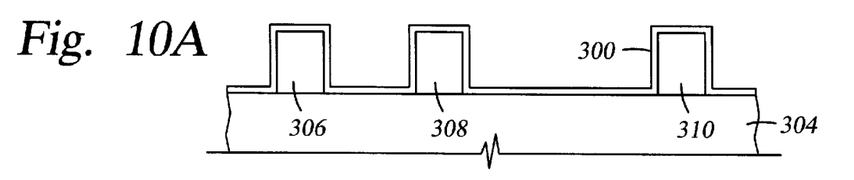
FIGS. 10A–10E are schematic diagrams of the layers deposited on a substrate by the process of FIG. 9.
Figure 10B:
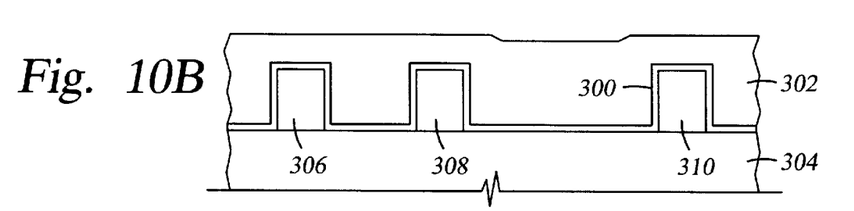

Referring to FIG. 10A, the PECVD lining layer 300 is deposited by introducing a reactive silicon containing compound such as dimethylsilane $((CH_3)_2SiH_2)$, an oxidizing gas such as $N_2O$, and a carrier gas such as helium. The substrate is maintained at a temperature of from about −20 to about 400° C., and preferably is maintained at a temperature of approximately 15 to 20° C. throughout the deposition of the PECVD lining layer. The PECVD lining layer 300 is deposited with a process gas that includes a mixture of the reactive silicon containing compound at a flow rate of about 5 sccm to about 500 sccm and the oxidizing gas at a flow rate of about 5 sccm to about 2000 sccm. The process gases are carried by an inert gas such He, Ar, Ne, or a relatively inert gas such as nitrogen, which are typically not incorporated into the film, at a flow rate of from about 0.2 to about 20 lpm. The process gases react at a pressure from about 0.2 to about 20 Torr, preferably less than 10 Torr, to form a conformal silicon oxide-based layer on the substrate surface 304 and metal lines 306, 308, 310. The reaction is plasma enhanced with a power density ranging from 0.05 $W/cm^2$ to 1000 $W/cm^2$, preferably a power density less than about 1 $W/cm^2$, most preferably a power density ranging from about 0.1 to about 0.3 $W/cm^2$.

For an 8" single wafer chamber, the high frequency RF source of approximately 13.56 MHz is preferably connected to a gas distribution system and driven at about 10 to about 200 W while a low frequency RF source of about 350 KHz is optionally connected to a susceptor and driven at about 0 to about 100 W. In a preferred embodiment, the high frequency RF source is driven at about 10 W to about 150 W of constant RF power, or at from about 20 W to about 250 W of pulsed RF power and the low frequency RF source is driven at about 0 to about 50 W of pulsed RF power.

The oxidized liner layer is then cured at a reduced pressure and a temperature from about 300° C. to about 450° C. Optionally, curing could be conducted after deposition of additional dielectric layers.

The above process conditions result in the deposition of a PECVD lining layer 300 (at about 2000 Å per minute) for the subsequent deposition of the gap filling layer 302 shown in FIG. 6B. The lining layer obtained from dimethylsilane has sufficient C—H bonds to be hydrophobic, and is an excellent moisture barrier.

Figure 10C:
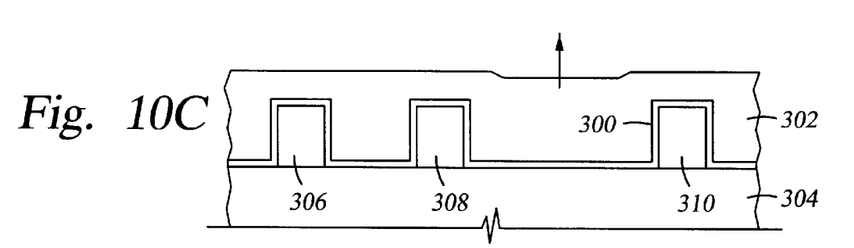
Figure 10D:
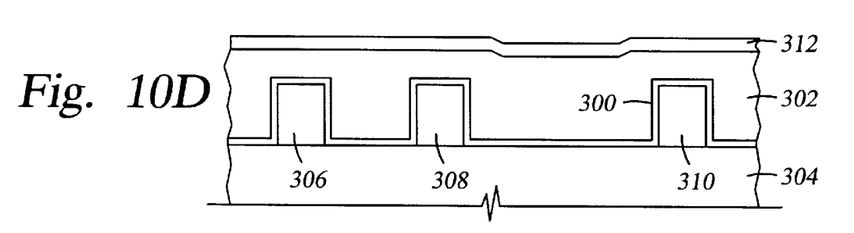

The process gases for the nano-porous copolymer layer 302 preferably include p-xylylene, a polyvinyl comonomer that contains thermally labile groups, and an inert carrier gas, such as helium. The process gas flows preferably range from 5–200 sccm for the p-xylylene, 2–120 sccm for the comonomer, and 50–200 sccm for He. The most preferred gas flows range from 15–60 sccm for the p-xylylene, 7–28 sccm for the comonomers, and 50–200 sccm for He. These flow rates are given for a chamber having a volume of approximately 5.5 to 6.5 liters. Preferably, the deposition chamber is maintained at a pressure of about 0.1 to about 0.5 torr during deposition of the copolymer layer 302. The copolymer layer 302 is preferably cured as shown in FIG. 10C to form gas bubbles prior to deposition of a cap layer 312 as shown in FIG. 10D. Curing is done in the reactor 10 by heating under an inert gas atmosphere at atmospheric pressure or above.

The copolymer layer is preferably cured at a gradually increasing temperature to convert the labile organic groups to dispersed microscopic gas bubbles that are retained in the cured film in a closed cell structure. A preferred curing process comprises a heating time period of about 10 minutes, including gradually raising the temperature by about 50° C./min. to a final temperature of about 400° C. or more. Dispersion of the gas bubbles can be controlled by varying the temperature/time profile and by controlling the concentration of labile organic groups in the deposited film.

Figure 10E:
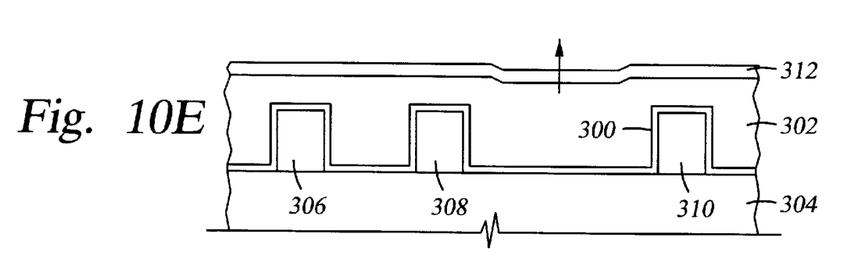

Referring to FIG. 10D, after deposition of the copolymer layer 302, the apparatus optionally resumes deposition of a reactive silicon containing component for deposition of a capping layer 312. Referring to FIG. 10E, after deposition of the capping layer, the deposited layers may be further cured in a furnace or another chamber at a temperature from about 200° C. to about 450° C. to drive off remaining gases or vapors. Of course, processing conditions will vary according to the desired characteristics of the deposited films.

HYPOTHETICAL EXAMPLE 1

(1,3-bis(diazocyclopentadienylallylmethyl) disiloxane)

To further illustrate the process of the invention, an eight inch diameter silicon wafer is mounted on a fixed substrate support maintained at a temperature of about 50° C. in a C×Z or D×Z deposition chamber, available from Applied Materials, Inc., of Santa Clara, Calif., configured substantially as shown in FIGS. 1 through 8. About 30 grams of cyclic p-xylylene dimer is loaded into the vaporizer 10 and the vaporizer is then heated to about 150° C. to about 200° C. The gate valve 20 separating the vaporizer 10 from the reaction chamber 30 is then opened, and the vapors of dimer are allowed to flow through a mass flow controller into the decomposition chamber tube 32 which is preheated to a temperature of about 650° C. The exit gate valve 40 of the reaction chamber 30 is then opened and the vaporized reactive p-xylylene formed in the chamber 30 then flows to the deposition chamber 60 at a rate of about 40 sccm. The lid of the deposition chamber 60 is maintained at a temperature of about 150° C. and the walls of the chamber 60 are maintained at about 100° C. Then 1,3-bis (diazocyclopentadienylallylmethyl)disiloxane is introduced into the chamber 60 at a rate of 15 sccm. About 50 sccm of nitrogen and about 25 sccm of backside helium are introduced into the deposition chamber 60 during the deposition and the valve 80 is set to maintain a pressure of 120 mTorr in the deposition chamber. The reactive p-xylylene monomer and comonomer vapors contact the silicon wafer 200 and copolymerize thereon. After about 2–3 minutes, the flow of reactive monomer vapors is shut off by first shutting the gate valve 20 between the vaporizer 10 and the reaction chamber 30, and then, after pumping out the chamber 30 with nitrogen to remove all monomer vapors from that chamber, and shutting off the second gate valve 40. The wafer 200 is then removed from the chamber 60.

HYPOTHETICAL EXAMPLE 2

(diazoquinoylmethyldiallylsilane)

To further illustrate the process of the invention, an eight inch diameter silicon wafer is mounted on a fixed substrate support maintained at a temperature of about 50° C. in a C×Z or D×Z deposition chamber, available from Applied Materials, Inc., of Santa Clara, Calif., configured substantially as shown in FIGS. 1 through 8. About 30 grams of cyclic p-xylylene dimer is loaded into the vaporizer 10 and the vaporizer is then heated to about 150° C. to about 200° C. The gate valve 20 separating the vaporizer 10 from the reaction chamber 30 is then opened, and the vapors of dimer are allowed to flow through a mass flow controller into the decomposition chamber tube 32 which is preheated to a temperature of about 650° C. The exit gate valve 40 of the reaction chamber 30 is then opened and the vaporized reactive p-xylylene formed in the chamber 30 then flows to the deposition chamber 60 at a rate of about 40 sccm. The lid of the deposition chamber 60 is maintained at a temperature of about 150° C., and the walls of the chamber 60 are maintained at about 100° C. Then diazoquinoylmethyldiallylsilane is introduced into the chamber 60 at a rate of 15 sccm. About 50 sccm of nitrogen and about 25 sccm of backside helium are introduced into the deposition chamber 60 during the deposition and the valve 80 is set to maintain a pressure of 120 mTorr in the deposition chamber. The reactive p-xylylene monomer and comonomer vapors contact the silicon wafer 200 and copolymerize thereon. After about 2–3 minutes, the flow of reactive monomer vapors is shut off by first shutting the gate valve 20 between the vaporizer 10 and the reaction chamber 30, and then, after pumping out the chamber 30 with nitrogen to remove all monomer vapors from that chamber, and shutting off the second gate valve 40. The wafer 200 is then removed from the chamber 60.

While the foregoing is directed to the preferred embodiment of the present invention, other and further embodiments of the invention may be devised without departing from the basic scope thereof. The scope of the invention is determined by the claims which follow.

What is claimed is:

1. A method for depositing a low dielectric constant film, comprising:

condensing p-xylylene, or a derivative thereof, and a comonomer having thermally labile groups onto a surface of a substrate;

reacting the condensed p-xylylene and comonomer at a temperature that retains labile groups in a conformal copolymer layer; and curing the copolymer layer at a temperature sufficient to convert the labile groups to dispersed gas bubbles.

2. The method of claim 1, wherein the comonomer comprises diazocyclopentadienyl, diazoquinoyl, formyloxy, or glyoxyloyloxy groups.

3. The method of claim 1, wherein the comonomer is selected from a group consisting of bis(diazocyclopentadienylallyl)silane, 1,3-bis(allyldiazocyclopentadienylmethyl)disiloxane, diazoquinoylmethyldiallylsilane, diisopropenyldiformylorthosilicate, diallyldiglyoxyloyloxysilane, 1,3-diallyltetraformyloxydisiloxane, 2,4,6,8-tetravinyltetraformyloxycyclotetrasiloxane, cyclo-1,3,5-tris(vinylmethylsilano)-2,4,6-tris(formatomethylene), cyclo-1,3,5,7-tetra(vinylmethylsilano)-2,6-dioxy-4,8-bis(glyoxyloylmethylene), and combinations thereof.

4. The method of claim 1, wherein the p-xylylene an the comonomer are deposited at a temperature less than 40° C.

5. The method of claim 1, wherein the copolymer film is cured at a final temperature of at least 300° C.

6. A process for depositing a low dielectric constant film, comprising:

depositing a conformal lining layer on a substrate having a patterned metal layer from process gases comprising one or more reactive silicon containing compounds and an oxidizing gas;

condensing p-xylylene, or a derivative thereof, and a comonomer having thermally labile groups onto the conformal lining layer;

reacting the condensed p-xylylene and comonomer at a temperature that retains labile groups in a copolymer layer; and curing the copolymer layer at a temperature sufficient to convert the labile groups to dispersed gas bubbles.

7. The process of claim 6, wherein the comonomer comprises diazocyclopentadienyl, diazoquinoyl, formyloxy, or glyoxyloyloxy groups.

8. The process of claim 6, wherein the comonomer is selected from a group consisting of bis(diazocyclopentadienylallyl)silane, 1,3-bis(allyldiazocyclopentadienylmethyl)disiloxane, diazoquinoylmethyldiallylsilane, diisopropenyldiformylorthosilicate, diallyldiglyoxyloyloxysilane, 1,3-diallyltetraformyloxydisiloxane, 2,4,6,8-tetravinyltetraformyloxycyclotetrasiloxane, cyclo-1,3,5-tris(vinylmethylsilano)-2,4,6-tris(formatomethylene), cyclo-1,3,5,7-tetra(vinylmethylsilano)-2,6-dioxy-4,8-bis(glyoxyloylmethylene), and combinations thereof.

9. The process of claim 6, further comprising the step of depositing a capping layer on the copolymer layer from the one or more reactive silicon containing compounds and the oxidizing gas.

10. The process of claim 9, wherein the silicon containing compounds are organosilane or organosiloxane compounds and each silicon atom is bonded to one or two carbon atoms and to at least one hydrogen atom, and wherein two or more silicon atoms in the same molecule are separated by no more than two carbon atoms or by no more than one oxygen atom.

11. The process of claim 9, wherein the silicon containing compound or mixture comprises methylsilane, dimethylsilane, 1,2-disalanoethane, 1,3-dimethyldisiloxane, 1,3,5-trisilanacyclohexane, or cyclo-1,3,5,7-tetrasilano-2,6-dioxy-4,8-dimethylene.

\* \* \* \* \*